(12) United States Patent
Port et al.

(10) Patent No.: US 11,736,081 B2
(45) Date of Patent: Aug. 22, 2023

(54) AUDIO ENHANCEMENT IN RESPONSE TO COMPRESSION FEEDBACK

(71) Applicant: Dolby Laboratories Licensing Corporation, San Francisco, CA (US)

(72) Inventors: Timothy Alan Port, Drummoyne (AU); William Thomas Rowley, Glebe (AU); Winston Chi Wai Ng, Sydney (AU); Sebastian P. B. Holzapfel, Mountain View, CA (US)

(73) Assignee: DOLBY LABORATORIES LICENSING CORPORATION, San Francisco, CA (US)

( * ) Notice: Subject to any disclaimer, the term of this patent is extended or adjusted under 35 U.S.C. 154(b) by 0 days.

(21) Appl. No.: 17/255,329

(22) PCT Filed: Jun. 20, 2019

(86) PCT No.: PCT/US2019/038322
§ 371 (c)(1),
(2) Date: Dec. 22, 2020

(87) PCT Pub. No.: WO2019/246449
PCT Pub. Date: Dec. 26, 2019

(65) Prior Publication Data
US 2021/0273623 A1 Sep. 2, 2021

Related U.S. Application Data

(60) Provisional application No. 62/688,625, filed on Jun. 22, 2018.

(51) Int. Cl.
*H03G 5/16* (2006.01)
*H03G 9/00* (2006.01)
(Continued)

(52) U.S. Cl.
CPC ............. *H03G 5/165* (2013.01); *H03G 9/005* (2013.01); *H03G 9/025* (2013.01); *H04R 3/04* (2013.01);
(Continued)

(58) Field of Classification Search
CPC ........ H03G 5/165; H03G 9/005; H03G 9/025; H03G 7/08; H04R 3/04; H04R 1/326;
(Continued)

(56) References Cited

U.S. PATENT DOCUMENTS 4,412,100 A * 10/1983 Orban ..................... H03G 9/02
381/100
4,641,361 A 2/1987 Rosback
(Continued)

FOREIGN PATENT DOCUMENTS

CN 103501165 A 1/2014
KR 101651828 B1 * 8/2016
(Continued)

OTHER PUBLICATIONS

Mu et al, A Timbre Matching Approach to enhance audio quality of psychoacoustic bass enhancement system (Year: 2013).*
(Continued)

*Primary Examiner* — Matthew A Eason
*Assistant Examiner* — Kuassi A Ganmavo (57) ABSTRACT

In some embodiments, a method for performing enhancement on an audio signal to generate an enhanced audio signal in response to feedback indicative of amount of compression applied to at least one frequency band of the enhanced audio signal. In typical embodiments, the enhancement is or includes bass enhancement. Examples of other types of enhancement performed in other embodiments include dialog enhancement, upmixing, frequency shifting, harmonic injection or transposition, subharmonic
(Continued)

injection, virtualization, and equalization. Other aspects are systems (e.g., programmed processors) and devices (e.g., devices having physically-limited bass reproduction capabilities, such as, for example, a notebook, tablet, mobile phone, or other device with small speakers) configured to perform any embodiment of the method.

14 Claims, 1 Drawing Sheet

(51) Int. Cl.
    *H03G 9/02*     (2006.01)
    *H04R 3/04*     (2006.01)
    *H04R 1/32*     (2006.01)
    *H03F 3/20*     (2006.01)
    *H03G 7/08*     (2006.01)
    *H04R 1/08*     (2006.01)

(52) U.S. Cl.
    CPC ............... *H03F 3/20* (2013.01); *H03G 7/08* (2013.01); *H04R 1/08* (2013.01); *H04R 1/326* (2013.01); *H04R 2420/09* (2013.01)

(58) Field of Classification Search
    CPC .. H04R 1/08; H04R 2420/09; H04R 2430/09; H04R 2430/01; H03F 3/781; H03F 3/20
    See application file for complete search history.

(56) References Cited

U.S. PATENT DOCUMENTS

| | | | |
|---|---|---|---|
| 5,737,434 A * | 4/1998 | Orban | H03G 7/06 381/104 |
| 8,538,749 B2 | 9/2013 | Visser et al. | |
| 8,615,093 B2 | 12/2013 | Hung et al. | |
| 8,751,028 B2 | 6/2014 | Yuen et al. | |
| 8,929,567 B2 | 1/2015 | Crockett et al. | |
| 9,319,789 B1 | 4/2016 | Nielsen | |
| 9,729,969 B2 | 8/2017 | Risberg | |
| 9,900,690 B2 | 2/2018 | Risberg | |
| 2003/0015082 A1* | 1/2003 | Brennan | G10D 7/06 84/380 R |
| 2009/0052695 A1 | 2/2009 | Yamada | |
| 2009/0281803 A1* | 11/2009 | Chen | G10L 19/012 704/226 |
| 2010/0086148 A1 | 4/2010 | Hung | |
| 2010/0150379 A1* | 6/2010 | Craig | H03G 9/18 381/108 |
| 2012/0116755 A1* | 5/2012 | Park | G10L 21/02 704/205 |
| 2014/0105419 A1* | 4/2014 | Vickers | H03G 3/00 381/104 |
| 2015/0010168 A1 | 1/2015 | Cheng | |
| 2015/0270819 A1* | 9/2015 | Seefeldt | H04R 3/04 700/94 |
| 2015/0281853 A1* | 10/2015 | Eisner | H04R 25/505 381/312 |
| 2017/0048615 A1* | 2/2017 | Son | G10L 19/167 |
| 2017/0201221 A1* | 7/2017 | Seefeldt | H03G 9/025 |
| 2018/0014125 A1 | 1/2018 | You | |

FOREIGN PATENT DOCUMENTS

| | | |
|---|---|---|
| KR | 101651828 B1 | 8/2016 |
| WO | 2012177572 A2 | 12/2012 |
| WO | 2017202460 | 11/2017 |

OTHER PUBLICATIONS

Pueo, B., et al. "Strategies for Bass Enhancement in Multiactuator Panels for Wave Field Synthesis" Applied Acoustics, v 71, No. 8, pp. 722-730, Aug. 2010.

* cited by examiner

AUDIO ENHANCEMENT IN RESPONSE TO COMPRESSION FEEDBACK

CROSS-REFERENCE TO RELATED APPLICATION(S)

This application claims the benefit of priority to U.S. Provisional Patent Application No. 62/688,625, filed Jun. 22, 2018, which is hereby incorporated by reference in its entirety.

TECHNICAL FIELD

The invention pertains to methods and systems for performing enhancement (e.g., bass enhancement) and compression on an audio signal to generate an enhanced audio signal in response to feedback indicative of compression applied to each of at least two frequency bands of the enhanced audio signal. In some embodiments, the enhancement includes at least one of psychoacoustic bass enhancement (e.g., harmonic transposition) and equalization-type bass enhancement, performed in response to feedback indicative of amount of compression applied to individual frequency bands of the bass enhanced audio signal.

BACKGROUND OF THE INVENTION

There are several known methods for modifying an audio signal (thereby generating an enhanced audio signal) to enhance the low frequency (bass) content perceived during playback of the enhanced audio signal. These can be categorized as:

"equalization-type bass enhancement" technologies which enhance the real (physical) bass response of a speaker employed for playback by boosting low frequency content via equalization strategies, or "psychoacoustic bass enhancement" technologies which enhance the perceived bass response of a speaker (e.g., a small loudspeaker) employed for playback via psychoacoustic strategies (e.g., "virtual bass" synthesis or generation methods) designed to increase the perceived level of bass content of an audio signal during playback by at least one loudspeaker that cannot physically reproduce bass frequencies of the audio signal.

Equalization strategies are simpler to implement and are generally deemed to provide a better listening experience than psychoacoustic strategies. Thus, if a speaker (to be employed for playback of an audio signal) is capable of reproducing real/physical low frequency content, equalization-type bass enhancement is typically applied to the signal rather than psychoacoustic bass enhancement. In some cases (e.g., when a speaker to be employed for playback is not capable of reproducing real/physical low frequency content), psychoacoustic bass enhancement is employed to replace or supplement equalization-type bass enhancement. However, even when both types of bass enhancement were available for application to an audio signal (e.g., in a bass enhancement subsystem of an overall audio signal processing system) it had not been known until the present invention to apply both types of bass enhancement (e.g., to selectively apply one or the other or both of them) in a manner controlled by an amount of compression being applied to individual frequency bands of the resulting bass-enhanced signal (e.g., the output of the bass enhancement subsystem).

At volume levels (of an input audio signal to undergo enhancement and playback) which are significantly below a speaker's maximum operating level, equalization-type bass enhancement strategies typically work well. However, at higher volume levels, boosting real/physical low frequency content by equalization-type bass enhancement may cause a speaker to distort at these low frequencies.

It is known to guard against speaker distortion by using a multiband compressor (e.g., the Audio Regulator of the Dolby Audio API) which attenuates individual frequency bands of an audio signal according to band energy thresholds which may be configured based on a playback system's real-world distortion characteristics for energy in individual bands. A multiband compressor (sometimes referred to herein as a "regulator") may limit or attenuate, but does not boost, signal level in any frequency band of the audio signal on which it operates.

However, equalization-type bass enhancement to boost low frequency content may be counteracted (especially when playback at high volumes is intended) by multiband compression (implemented by a regulator) to reduce speaker distortion, sometimes to the point of complete cancellation of the bass enhancement. Application of both such bass enhancement and compression may even have the unintended consequence of reducing overall playback volume, since the regulator may also attempt to preserve timbre (e.g., by not only attenuating at least one band to prevent distortion but also attempting to attenuate neighbouring bands by a similar amount).

Psychoacoustic strategies for bass enhancement (e.g., those implemented by "Virtual Bass" processing of the Dolby Audio API) supplement energy from lower frequency bands (which the playback speaker is unable to reproduce) with energy in higher frequency bands which the speaker is able to reproduce. Typically this type of bass enhancement processing is used when a speaker is not capable of reproducing low frequency content at any volume level, due to fundamental physical limitations of the speaker. However, it could also be used (as it is in some embodiments of the present invention) when it is possible but not desirable (e.g., due to a more nuanced system limitation) for a speaker to reproduce the relevant low frequency content.

One conventional type of psychoacoustic bass enhancement is bass synthesis, which is a collective name for a class of techniques that add in components to the low frequency range of an audio signal in order to enhance the bass that is perceived during playback of the enhanced signal. Some such techniques (sometimes referred to as sub bass synthesis methods) create low frequency components below the signal's existing frequency components in order to extend and improve the lowest frequency range. Other techniques in the class, known as "virtual pitch" algorithms, generate audible harmonics from an inaudible bass range (e.g., a bass range that is inaudible when the signal is rendered by small loudspeakers), so that the generated harmonics improve the perceived bass response. Virtual pitch methods typically exploit the well-known "missing fundamental" phenomenon, in which low pitches (one or more low frequency fundamentals, and lower harmonics of each fundamental) can sometimes be inferred by a human auditory system from upper harmonics of the low frequency fundamental(s), when the fundamental(s) and lower harmonics (e.g., the first harmonic of each fundamental) themselves are missing.

Some virtual pitch methods are designed to increase the perceived level of bass content of an audio signal during playback of the signal by one or more loudspeakers that cannot physically reproduce bass frequencies of the audio signal. Such methods typically include steps of analyzing the bass frequencies present in input audio and enhancing the input audio by generating (and including in the enhanced audio) audible harmonics that aid the perception of lower frequencies that are missing during playback of the enhanced audio (e.g., playback by small loudspeakers that cannot physically reproduce the missing lower frequencies). Such methods perform harmonic transposition of frequency components of the input audio that are expected to be inaudible during playback of the input audio (i.e., having frequencies too low to be audible during playback on the expected speaker(s)), to generate audible higher frequency components (i.e having frequencies that are sufficiently high to be audible during playback on the expected speaker(s)). For example, an audio signal may have an inaudible range of frequency components, and an audible range of frequency components above the inaudible range. Harmonic transposition of frequency components in the inaudible range can generate transposed frequency components in a portion of the audible range, which can enhance the perceived level of bass content of the audio signal during playback. Such harmonic transposition may include application of multiple transposition factors to each relevant frequency component of the input audio, to generate multiple harmonics of the component.

BRIEF DESCRIPTION OF THE INVENTION

In a first class of embodiments, the invention is a method for performing enhancement on an audio signal to generate an enhanced audio signal, in response to feedback indicative of amount of compression applied to each of at least two frequency bands of the enhanced audio signal. In typical embodiments in this class, the enhancement is or includes bass enhancement. Examples of other types of enhancement performed in other embodiments include (but are not limited to): dialog enhancement, upmixing, frequency shifting, harmonic injection or transposition, subharmonic injection, virtualization, and equalization.

Some embodiments in the first class include steps of: enhancing the audio signal (e.g., in an enhancement stage or subsystem) to generate an enhanced audio signal; and performing multiband compression (e.g., in a regulator coupled to an output of the enhancement stage or subsystem) on the enhanced audio signal (e.g., in an effort to prevent distortion upon playback), where the enhancement is performed in response to compression feedback indicative of amount of compression applied to each of at least two frequency bands of the enhanced audio signal. In some such embodiments, the enhancement is or includes one or both of psychoacoustic bass enhancement (e.g., harmonic transposition) and equalization-type bass enhancement to generate a bass enhanced audio signal in response to the input audio signal, and the bass enhancement is performed in response to feedback indicative of amount of compression applied to each of at least two frequency bands of the bass enhanced audio signal (e.g., to selectively apply one or the other, or both, of the two types of bass enhancement to the input audio signal) in a manner controlled by the feedback.

In some embodiments, the inventive method and system implements a dynamic hybrid approach to use of both (or a selected one of) equalization-type and psychoacoustic bass enhancement to generate an enhanced signal, followed by applying multiband compression (sometimes referred to as regulation) to the enhanced signal in an effort (i.e., in a manner intended) to prevent distortion upon playback. When (e.g., at lower volume levels of the input signal) the enhancement boosts levels of the input audio signal in frequency bands (typically, low frequency bands) such that the enhancement would not cause distortion upon playback (or limiting by the regulator in those bands), equalization-type bass enhancement (e.g., relatively more equalization-type bass enhancement than psychoacoustic bass enhancement) is used to increase levels (energy) in the bands and improve the overall bass response. When (e.g., at higher volume levels of the input signal) the enhancement boosts levels of the input signal in low frequency bands such that the enhancement would cause distortion upon playback (or limiting by the regulator in those bands), psychoacoustic bass enhancement (e.g., relatively more psychoacoustic bass enhancement than equalization-type bass enhancement) is employed, to increase levels (add energy) to higher bands improving the overall perceived bass response without increasing the energy of any lower bands that are at the brink of distortion/limiting. In typical embodiments, determining when to favor equalization-type enhancement over psychoacoustic enhancement is automated on a block-by-block basis by generating feedback indicative of the amount of compression applied to each band of the enhanced signal, and implementing a feedback loop in which the feedback is employed to control generation of the enhanced signal.

Another aspect of the invention is a system (e.g., a device having physically-limited or otherwise limited bass reproduction capabilities, such as, for example, a notebook, tablet, mobile phone, or other device with small speakers) configured to perform any embodiment of the inventive method on an input audio signal.

In a class of embodiments, the invention is an audio playback system (e.g., a notebook, tablet, mobile phone, or other device with small speakers, or a playback system which has limited (e.g., physically-limited) bass reproduction capabilities), and is configured to perform audio enhancement (e.g., bass enhancement) on audio in response to compression feedback (in accordance with any embodiment of the inventive method) to generate enhanced audio, and to playback the enhanced audio.

In some embodiments, the inventive system is or includes a general or special purpose processor programmed with software (or firmware) and/or otherwise configured to perform an embodiment of the inventive method. In some embodiments, the inventive system is a general purpose processor, coupled to receive input audio data, and programmed (with appropriate software) to generate output audio data by performing an embodiment of the inventive method. In some embodiments, the inventive system is a digital signal processor, coupled to receive input audio data, and configured (e.g., programmed) to generate output audio data in response to the input audio data by performing an embodiment of the inventive method.

Aspects of the invention include a system configured (e.g., programmed) to perform any embodiment of the inventive method, and a computer readable medium (e.g., a disc) which stores code for implementing any embodiment of the inventive method.

NOTATION AND NOMENCLATURE

Throughout this disclosure, including in the claims, the expressions "band" and "frequency band" are used interchangeably, as synonyms.

Throughout this disclosure, including in the claims, the expression "multiband compression" of or on an audio signal (e.g., on frequency domain data indicative of an enhanced audio signal or other audio signal, or on one or more channels of a multi-channel audio signal) denotes limiting compression on a band-by-band basis (in at least two different frequency bands) which does not increase level of the signal in any frequency band. In each band, multiband compression either reduces (or does not change, or does not change by a substantial or significant amount) level of the signal. Multiband compression is sometimes referred to herein as "regulation," and a compressor which performs or is configured to perform multiband compression is sometimes referred to herein as a "regulator."

Throughout this disclosure, including in the claims, the expression "enhancement" (or "audio enhancement") of or on an audio signal (e.g., on frequency domain data indicative of an audio signal, or one or more channels of a multi-channel audio signal) denotes any enhancing operation performed on the signal. For example, enhancement may be an enhancing operation performed on a band-by-band basis at least two different frequency bands of the signal) on the signal. Examples of audio enhancement include, but are not limited to, bass enhancement (e.g., equalization-type bass enhancement or psychoacoustic bass enhancement), dialog enhancement, upmixing, frequency shifting, harmonic injection or transposition, subharmonic injection, virtualization, and equalization.

Throughout this disclosure, including in the claims, the expression performing an operation "on" a signal or data (e.g., filtering, scaling, transforming, or applying gain to, the signal or data) is used in a broad sense to denote performing the operation directly on the signal or data, or on a processed version of the signal or data (e.g., on a version of the signal that has undergone preliminary filtering or pre-processing prior to performance of the operation thereon).

Throughout this disclosure including in the claims, the expression "system" is used in a broad sense to denote a device, system, or subsystem. For example, a subsystem that implements a decoder may be referred to as a decoder system, and a system including such a subsystem (e.g., a system that generates X output signals in response to multiple inputs, in which the subsystem generates M of the inputs and the other X−M inputs are received from an external source) may also be referred to as a decoder system.

Throughout this disclosure including in the claims, the term "processor" is used in a broad sense to denote a system or device programmable or otherwise configurable (e.g., with software or firmware) to perform operations on data (e.g., audio, or video or other image data). Examples of processors include a field-programmable gate array (or other configurable integrated circuit or chip set), a digital signal processor programmed and/or otherwise configured to perform pipelined processing on audio or other sound data, a programmable general purpose processor or computer, and a programmable microprocessor chip or chip set.

Throughout this disclosure including in the claims, the term "couples" or "coupled" is used to mean either a direct or indirect connection. Thus, if a first device couples to a second device, that connection may be through a direct connection, or through an indirect connection via other devices and connections.

DETAILED DESCRIPTION OF THE PREFERRED EMBODIMENTS

Many embodiments of the present invention are technologically possible. It will be apparent to those of ordinary skill in the art from the present disclosure how to implement them. Embodiments of the inventive system, method, and medium will be described with reference to FIGS. 1 and 2.

Figure 1:
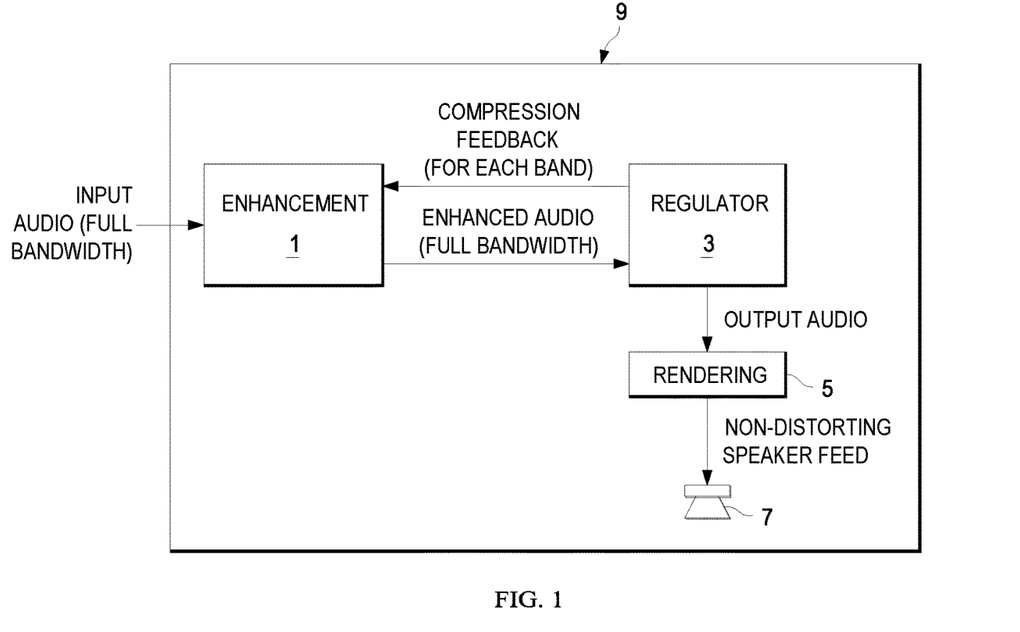
FIG. 1 is a block diagram of a system configured to perform audio enhancement (e.g., bass enhancement) in accordance with an embodiment of the invention.

FIG. 1 is a block diagram of a system (9) configured to perform audio enhancement in accordance with an embodiment of the invention. In the FIG. 1 system, enhancement subsystem 1 is coupled and configured to perform audio enhancement on an input audio signal, thereby generating an enhanced audio signal. Regulator 3 (sometimes referred to as multiband compression subsystem 3) is coupled to enhancement subsystem 1 and configured to perform multiband compression on the enhanced audio signal, thereby generating an output audio signal which is a compressed, enhanced audio signal. In operation, subsystem 3 applies compression on a band-by-band basis to the enhanced audio signal (i.e., to reduce or leave unchanged the level of each frequency band, at each time of a sequence of times, of the enhanced audio signal) in a manner intended to prevent distortion upon playback of the compressed, enhanced audio signal output from subsystem 3. Subsystem 3 is also configured to generate a compression signal indicative of the amount of compression (level attenuation) applied by subsystem 3 to each of at least one frequency band (e.g., to each of at least two individual frequency bands, or to each of the entire set of individual frequency bands) of the enhanced audio signal, and this compression signal is provided as a feedback to enhancement subsystem 1. The compression signal is thus a feedback signal indicative of amount of compression applied by regulator subsystem 3 to at least one frequency band (or each of at least two frequency bands) of the enhanced audio signal.

Enhancement subsystem 1 is configured to perform audio enhancement in response to the compression signal (a feedback signal indicative of amount of compression applied to at least one frequency band (e.g., each of at least two individual frequency bands) of the enhanced audio signal.

The FIG. 1 system also includes rendering subsystem 5 (coupled to regulator 3) and speaker 7 (coupled to rendering subsystem 5). In operation, the compressed, enhanced audio signal output from regulator 3 is provided to rendering subsystem 5, and subsystem 5 (with speaker 7) perform playback of audio content of the compressed, enhanced audio signal. Subsystem 5 is configured to generate a speaker feed in response to the compressed, enhanced audio signal. The speaker feed is provided to speaker 7, and speaker 7 is configured to emit sound in response to the speaker feed. Typically, the compression performed by regulator 3 prevents the sound from being distorted.

Thus, subsystem 5 is configured to render audio content (indicated by the of the compressed, enhanced audio signal) by converting the content into the speaker feed of the compressed, enhanced audio signal, and subsystem 5 (together with speaker 7) is configured to render such audio content by converting the content into the speaker feed and converting the speaker feed to sound.

System 9 of FIG. 1 may be a processor which is programmed (or otherwise configured) to perform an embodiment of the inventive enhancement method, and in which elements 1 and 3 (and optionally also elements 5 and 7) of FIG. 1 are implemented as subsystems (e.g., stages) of the processor. In another example, system 9 of FIG. 1 is a playback device configured to perform an embodiment of the inventive enhancement method, and in which elements 1, 3, 5, and 7 of FIG. 1 are implemented as subsystems (e.g., stages) of the playback device.

Figure 2:
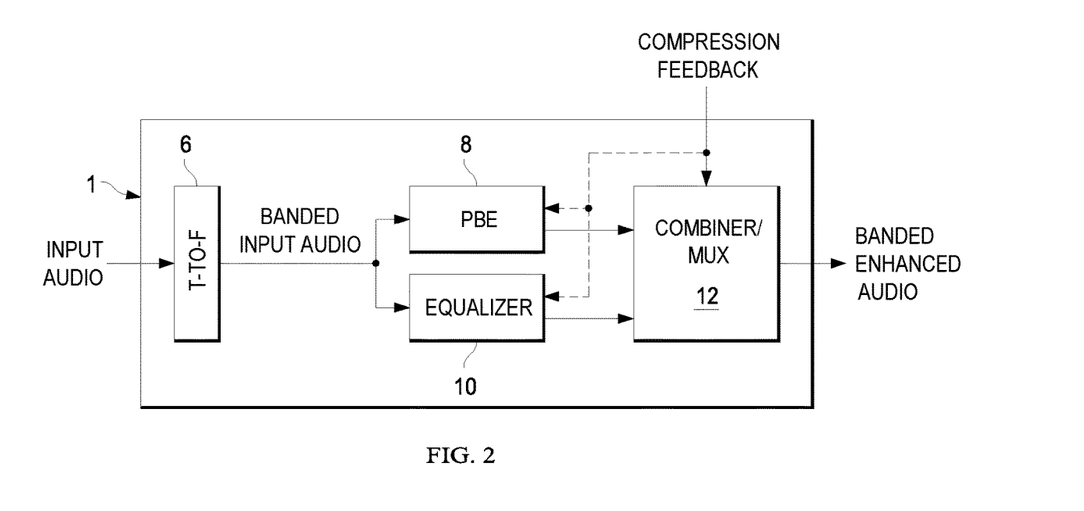
FIG. 2 is a block diagram of an embodiment of enhancement subsystem 1 of the FIG. 1 system.

In some embodiments, the inventive system (e.g., enhancement subsystem 1 of FIG. 1) is configured to perform one or both of psychoacoustic bass enhancement (e.g., harmonic transposition) and equalization-type bass enhancement to generate a bass enhanced audio signal in response to the input audio signal, and the bass enhancement is performed in response to feedback indicative of amount of compression applied by a regulator (e.g., regulator 3) to each of at least two frequency bands of the bass enhanced audio signal (e.g., to selectively apply one or the other, or both, of the two types of bass enhancement to the input audio signal) in a manner controlled by the feedback. FIG. 2 is a block diagram of an example of such an embodiment of enhancement subsystem 1 of the FIG. 1 system.

In FIG. 2, transform element 6 is configured to perform a time domain-to-frequency domain transform (e.g., FFT) on an input audio signal to generate banded input audio indicative of the audio content of the input audio signal, such that the banded input audio includes a sequence of frequency components for each different frequency band of a set of frequency bands. Thus, in the FIG. 2 embodiment (as in some other embodiments of the invention) the input data to be enhanced are banded frequency domain audio data indicative of the audio content of the input audio signal. Psychoacoustic bass enhancement ("PBE") subsystem 8 is coupled and configured to perform psychoacoustic bass enhancement on the banded input audio (typically, including by boosting (increasing the level of) content in frequency bands other than the lowest frequency bands). Equalization-type bass enhancement subsystem ("equalizer") 10 is coupled and configured to perform equalization-type bass enhancement on the banded input audio (typically, to boost content in low frequency bands). Combination subsystem 12 is coupled to receive the audio output of each of subsystems 8 and 10, and the compression feedback signal ("compression feedback") generated by regulator 3 of FIG. 1, and is configured to generate, in response thereto, banded enhanced audio. The banded enhanced audio is the output of the FIG. 2 embodiment of enhancement subsystem 1 and is provided to regulator 3 of FIG. 1. The compression feedback is indicative of amount of compression applied by regulator 3 to each of at least two frequency bands of the banded enhanced audio. Typically, the frequency bands of the banded enhanced audio (output from combination subsystem 12) are the same as those to which regulator 3 applies compression (and the same as those of the banded audio which is output from transform subsystem 6), and the compression feedback is indicative of amount of compression applied by regulator 3 to each of these bands.

Combination subsystem 12 is configured to time-division multiplex or combine the outputs of subsystems 8 and 10 to generate the banded enhanced audio to be (at any time): the output of one or the other of subsystems 8 and 10 for the time; or a combination (e.g., linear combination) of frequency components output from subsystems 8 and 10 for the time.

Combination subsystem 12 is typically configured to generate the banded enhanced audio as a sequence of banded enhanced audio values, with the banded enhanced audio values corresponding to each time (or time interval) consisting of values for each of a number of different frequency bands, and such that each of the values for one time (or time interval) and one band is:

a combination (e.g., linear combination) of frequency components output from subsystems 8 and 10 for the time (or time interval) and band (e.g., in response to some values of the compression feedback for the corresponding time or interval), or a frequency component output from one or the other of subsystems 8 and 10 for the time (or time interval) and band (e.g., in response to some other values of the compression feedback for the corresponding time or interval).

For example, when the compression feedback indicates that regulator 3 is not applying compression in any band, the output of subsystem 12 for each band (at the corresponding time or time interval) may be a frequency component output from subsystem 10. If the compression feedback (corresponding to a later time or time interval) then indicates that regulator 3 is applying compression in each band (to prevent distortion), the output of subsystem 12 for each band (at the corresponding time or interval) may be a frequency component output from subsystem 8.

For another example, when the compression feedback indicates that regulator 3 is not applying compression (or is applying a small amount of attenuation) in a band, the output of subsystem 12 for the band (at the corresponding time or time interval) may be a first linear combination of a frequency component output from subsystem 8 and a frequency component output from subsystem 10 (e.g., aX+bY, where a and b are factors, X is the frequency component output from subsystem 8, and Y is the frequency component output from subsystem 10). If the compression feedback (corresponding to a later time or time interval) then indicates that regulator 3 is applying compression (or is applying a greater amount of attenuation) in the band, the output of subsystem 12 for each band (at the corresponding time or interval) may be a second linear combination (different than the first linear combination) of a frequency component output from subsystem 8 and a frequency component output from subsystem 10 (e.g., cX+dY, where c is a factor different than a, a' is a factor different than h, X is the frequency component output from subsystem 8, and Y is the frequency component output from subsystem 10).

Alternatively (or additionally), the compression feedback is provided to subsystem 8 and/or subsystem 10 (as indicated by dashed lines in FIG. 2) to control the manner in which subsystem 8 and/or subsystem 10 performs bass enhancement. For example, operation of one or both of subsystems 8 and 10 may be enabled or disabled (during a time interval) in response to the compression feedback, and/or the manner in which one or both of subsystems 8 and 10 performs enhancement on the banded input audio may be controlled by the compression feedback.

For example, PBE subsystem 8 may perform harmonic transposition using even harmonics in response to some values of the compression feedback, and/or using odd harmonics in response to some other values of the compression feedback. In typical operation of the FIG. 2 system, bass enhancement by subsystem 8 and/or subsystem 10 is controlled (by the compression feedback) so as to prevent the bass enhancement from causing distortion (upon playback) in any specific band (given the amount of compression being applied by regulator 3 in that band), and/or to prevent regulator 3 from applying compression in one or more specific bands. Less (or a different type of) processing by subsystem 8 (or subsystem 10) in a band may be desired in the case that regulator 3 is applying a lot of attenuation in the band, to prevent distortion.

For example, a boost (applied by subsystem 10) in a band may be reduced in the case that the feedback indicates that regulator 3 applies a lot of attenuation (e.g., attenuation in excess of a predetermined threshold amount) in the band, e.g., in cases in which too much boosting (by subsystem 10) with high compression (by regulator 3) could result in distortion. In some embodiments, an amount or degree of processing by one of subsystems 8 or 10 is determined in response to the amount or degree of processing by the other one of subsystems 8 or 10 (which is in turn determined by the compression feedback), e.g., to keep a total amount or degree of processing by both subsystems 8 and 10 constant or at a desired amount.

Unless PBE subsystem 8 operates in response to compression feedback indicative of compression applied by regulator 3, regulator 3 typically cannot provide reliable speaker distortion protection, since perceptual bass enhancement is non-linear by definition.

In typical implementations of system 9 of FIG. 1, a full bandwidth compression feedback signal (indicative of compression applied by regulator 3 in each band of a full set of bands) is fed into enhancement subsystem 1 (sometimes referred to as an enhancement layer). In response, enhancement subsystem 1 produces an enhanced audio signal that is fed into regulator 3, and regulator 3 and rendering subsystem 5 operate to produce a non-distorted speaker feed. The compression feedback signal may have some gating to ensure there is no undesirable pumping of the signal output from regulator 3.

Typical reasons for a change in the amount of limiting (attenuation) applied by regulator 3 (in at least one band) include a change in playback volume due to a user control or a change in level of an audio signal provided to or generated by the inventive system. It is fundamentally important that the regulator be placed in series after the enhancement layer (in the sense that the regulator operates on the output of the enhancement layer) to ensure that the speaker is not fed with a signal that would cause it to distort.

Typical embodiments of the invention are based in part on the inventors' recognition that:

equalization strategies for bass enhancement break down at high system volumes due to speaker distortion and associated protective mechanisms such as multiband compression, and conventional configuration of equalization bass enhancement and psychoacoustic bass enhancement algorithms does not depend on feedback indicative of compression applied to the bass enhanced signal, and although psychoacoustic bass enhancement is sometimes not employed at all in systems where equalization-type bass enhancement is employed, it would often be desirable to conditionally employ psychoacoustic bass enhancement to supplement equalization-type bass enhancement (e.g., under conditions of high energy/compression levels in low frequency bands of the bass enhanced audio signal).

In some embodiments, the inventive system (e.g., enhancement subsystem 1 of FIG. 1) is configured to perform enhancement (other than, or in addition to, bass enhancement) to generate an enhanced audio signal (in response to an input audio signal) using compression feedback. We next describes examples of some types of such enhancement (e.g., performed by embodiments of enhancement subsystem 1) that can be controlled using compression feedback in some embodiments of the invention. The examples include:

1. Dialog Enhancement

When performing dialog enhancement (e.g., by operating an embodiment of enhancement subsystem 1), the level of a dialog enhancement signal (e.g., generated by the embodiment of enhancement subsystem 1) may be decreased in response to compression feedback from a regulator (e.g., regulator 3) to limit the maximum level (in one or more specific bands) of the dialog-enhanced audio signal which is asserted to the regulator, to cause such maximum level to be sufficiently low to prevent the regulator from compressing (limiting) audio in such band(s). If the level of the dialog enhancement signal is not so decreased when the regulator is limiting the dialog-enhanced audio signal (in at least one band), the dialog enhancement will often make the dialog (indicated by the compressed, dialog-enhanced audio signal output from the regulator) harder to understand rather than more intelligible.

In some alternative embodiments, the shape of the dialog enhancement curve (employed to perform dialog enhancement) may be changed in response to the compression feedback, to reduce the gain of the dialog-enhanced audio signal in each band (which is outside the typical speech frequency range, i.e., 300-3000 Hz, and is being compressed by the regulator as indicated by the compression feedback), to prevent the regulator (e.g., regulator 3) from continuing to apply compression in each such band of the dialog-enhanced audio signal. For example, when enhancement subsystem 1 is configured to perform the dialog enhancement, the gain of subsystem 1's output in each band within the speech frequency range would typically not be reduced (but the gain of subsystem 1's output in each band outside the speech frequency range would in some cases be reduced) in response to the compression feedback. This can be done to ensure that a timbre preservation mode of the regulator (e.g., regulator 3) does not result in a compressed, dialog-enhanced audio signal (output from the regulator) that has dialog that is too quiet and still ensure that increases in user-controlled volume result in an increase in dialog volume;

2. Upmixing

When performing upmixing (e.g., by operating an embodiment of enhancement subsystem 1), the amount of diffuse content (e.g., generated by the embodiment of enhancement subsystem 1) may be reduced (while keeping the direct content untouched) in response to compression feedback from a regulator (e.g., regulator 3), when the compression feedback indicates that the regulator is limiting relevant bands of the upmixed audio signal (i.e., relevant bands of at least one channel of multi-channel upmixed audio), to reduce the amount of energy of the upmixed audio signal that is fed into the regulator. Alternatively, the upmixing may be disabled (so that no upmixing is performed at all) in response to the compression feedback for specific time intervals in which the compression feedback indicates that this should be done;

3. Volume leveling, modeling, or automatic gain control (e.g., implemented by Dolby Volume). When performing volume modeling (e.g., by operating an embodiment of enhancement subsystem 1), the volume modeler may analyze incoming audio, group similar frequencies into critical bands, and apply appropriate amounts of gain to each band, in a manner controlled by compression feedback from a regulator (e.g., regulator 3) which compresses the output of the volume modeler. In response to the compression feedback, the volume modeler may adjust the frequency response for different playback levels (relative to an assumed reference level, which is typically around 85 decibels) to compensate for the way people perceive audio during playback at different playback levels. Thus, the volume modeling may assure that a user always hears the correct tonal balance, whether at high or low playback levels.

When performing volume leveling (e.g., by operating an embodiment of enhancement subsystem 1), the volume leveler may operate in a manner controlled by compression feedback from a regulator (e.g., regulator 3) which compresses the output of the volume leveler. The volume leveler may control playback level of input audio to maintain consistent playback level regardless of the source selection and content.

In some examples of implementations of enhancement subsystem 1, the enhancement subsystem may be controlled in response to compression feedback in any of the following ways:

a targeted reference level of a volume leveler or a reference level of a volume modeler (implemented by subsystem 1) may be adjusted in response to the compression feedback to ensure that subsystem 1 is not driving (e.g., continuously driving) regulator 3 to cause the regulator to compress audio in one or more specific bands; or the gain swing of automatic gain control (AGC) implemented by subsystem 1 may be adjusted in response to the compression feedback to limit the maximum level of the output of subsystem 1 (in one or more specific bands) is sufficiently low to prevent regulator 3 from compressing audio in such band(s);

4. Frequency Shift Block

To increase the speech intelligibility (e.g., of audio captured during conference calls), enhancement subsystem 1 may be implemented as a frequency shift block. When operating such an embodiment of enhancement subsystem 1, the frequency shift block may operate in a manner controlled by compression feedback from a regulator (e.g., regulator 3) which compresses the output of the frequency shift block. Typically, as a user increases the volume and the regulator starts limiting the frequency bands in the range of typical speech, the frequency shift block will shift all the frequencies in a direction that would give an increase in perceived volume taking into account the capabilities of the playback device (and optionally the noise level in the surrounding environment);

5. Harmonic Injection

In the case where bands are being limited by a regulator, compression feedback from the regulator can be provided to an embodiment of enhancement subsystem 1. The enhancement subsystem can operate in response to the compression feedback to inject harmonic psychoacoustic frequencies into an audio input signal (e.g., to provide virtual bass) and thereby generate an enhanced signal which is asserted to the input of the regulator. It should be noted that harmonic injection in this context is not limited to the traditional bass frequencies. It can be performed at all frequencies (with a fundamental frequency up to 12 KHz; after which the second harmonic is above the human hearing threshold);

6. Subharmonic Injection

When a signal is being limited in higher frequency bins by a regulator, compression feedback from the regulator can be provided to an embodiment of enhancement subsystem 1. The enhancement subsystem can operate in response to the compression feedback to generate subharmonics (having frequencies equal to (Fundamental frequency)/(n), where n is an integer) and to insert the subharmonics into an audio input signal, thereby generating an enhanced signal which is asserted to the input of the regulator. This has the advantage of working all the way up to 24 Khz. This will allow the perceived volume to increase when a user increases a volume control;

7. Virtualization

When performing virtualization (e.g., by operating an embodiment of enhancement subsystem 1), the virtualizer may operate in a manner controlled by compression feedback from a regulator (e.g., regulator 3) which compresses the output of the virtualizer. Virtualizers generally cause a volume change that might cause the regulator to limit certain bins. In some cases, this would cause a collapse in spatial audio, unless operation of the virtualizer is controlled (in accordance with an embodiment of the invention) by the compression feedback.

In one example of such virtualization, the virtualizer does not virtualize a height filter in the case where it is causing (as indicated by the compression feedback) the regulator to limit a band, and instead just render the audio to the listener plane. In another example of such virtualization, the virtualizer reduces the amount of reverb (the "wet" component) within the signal and just keeps the anechoic feed (the "dry" component) when the regulator is limiting the relevant bins (as indicated by the compression feedback); or 8. Equalization When performing equalization (e.g., by operating an embodiment of enhancement subsystem 1), the equalizer may operate in a manner controlled by compression feedback from a regulator (e.g., regulator 3) which compresses the output of the equalizer. An equalizer preset may cause the regulator to start limiting certain bins. The equalizer may decide (in response to the compression feedback) to change to another preset to avoid the limiting that occurs (as indicated by the compression feedback) due to the regulator component.

In some embodiments, the inventive system (e.g., enhancement subsystem 1 of FIG. 1) is configured to perform enhancement in response to compression feedback which indicates that compression is being applied in only in one band (e.g., the compression feedback indicates that no (a zero amount of) compression is being applied in each other band). For example; if regulator 3 is a multiband limiter with the bands 1-4000 Hz and 1000-20000 Hz, and if the content consists of a 500 Hz sine wave and this causes the speaker to distort, the regulator will not apply compression to the top band (1000-20000 Hz) and the compression feedback will indicate this.

In some embodiments, the inventive system (e.g., enhancement subsystem 1 of FIG. 1) is configured to perform enhancement (in response to compression feedback) in the time domain. For example, the enhancement may apply parametric filters (which may be implemented as time domain biquad filters). These parametric filters may be used to implement an equalization bass enhancement. For another example, the enhancement may apply a parametric low pass filter that adjusts its knee point based upon the compression feedback.

Enumerated example embodiments (EEEs) of the invention include the following:

EEE1. A method for audio signal compression and enhancement, including:

performing enhancement on an input audio signal to generate an enhanced audio signal; and performing multiband compression on the enhanced audio signal, thereby generating a compressed, enhanced audio signal, wherein the enhancement is performed in response to compression feedback indicative of amount of compression applied to each of at least two frequency bands of the enhanced audio signal.

EEE2. The method of EEE1, wherein the enhancement is bass enhancement, the bass enhancement is or includes at least one of psychoacoustic bass enhancement or equalization-type bass enhancement; and the enhanced audio signal is a bass enhanced audio signal.

EEE3. The method of EEE2, wherein the bass enhancement is performed in response to the compression feedback including by selectively applying one or the other, or both, of the psychoacoustic bass enhancement or the equalization-type bass enhancement to the input audio signal in a manner controlled by the compression feedback.

EEE4. The method of EEE1, wherein the enhancement is or includes at least one of dialog enhancement, upmixing, frequency shifting, harmonic injection, harmonic transposition, subharmonic injection, virtualization, equalization, volume modeling, volume leveling, or automatic gain control.

EEE5. The method of EEE1, wherein the multiband compression is performed on the enhanced audio signal, in a manner intended to prevent distortion upon playback of the compressed, enhanced audio signal.

EEE6. The method of EEE1, wherein the input audio signal is indicative of audio content, said method including a step of:

in response to the input audio signal, generating banded frequency domain audio data indicative of the audio content, such that the banded frequency domain audio data includes a sequence of frequency components for each different frequency band of a set of frequency bands, and wherein the enhancement is performed on the banded frequency domain audio data.

EEE7. The method of EEE1, wherein the enhancement is or includes automatic gain control.

EEE8. A system, including:

an enhancement subsystem coupled and configured to perform enhancement on an input audio signal to generate an enhanced audio signal; and a multiband compressor, coupled and configured to perform multiband compression on the enhanced audio signal, thereby generating a compressed, enhanced audio signal, and to provide compression feedback to the enhancement subsystem, wherein the compression feedback is indicative of amount of compression applied by the multiband compressor to each of at least two frequency bands of the enhanced audio signal, and wherein the enhancement subsystem is configured to perform the enhancement in response to the compression feedback.

EEE9. The system of EEE8, wherein the enhancement is bass enhancement, the bass enhancement is or includes at least one of psychoacoustic bass enhancement or equalization-type bass enhancement, and the enhanced audio signal is a bass enhanced audio signal.

EEE10. The system of EEE9, wherein the enhancement subsystem is configured to perform the bass enhancement in response to the compression feedback including by selectively applying one or the other, or both, of the psychoacoustic bass enhancement or the equalization-type bass enhancement to the input audio signal in a manner controlled by the compression feedback.

EEE11. The system of EEE8, wherein the enhancement is or includes at least one of dialog enhancement, upmixing, frequency shifting, harmonic injection, harmonic transposition, subharmonic injection, virtualization, equalization, volume modeling, volume leveling, or automatic gain control.

EEE12. The system of EEE8, wherein the enhancement is or includes automatic gain control.

EEE13. The system of EEE8, wherein said system is an audio playback system.

EEE14. The system of EEE8, wherein said system is a processor programmed to implement the enhancement subsystem and the multiband compressor.

EEE15. The system of EEE14, wherein said system is a digital signal processor configured to implement the enhancement subsystem and the multiband compressor.

In some embodiments, the invention is a system or device (e.g., a playback device or other device having physically-limited or otherwise limited bass reproduction capabilities, such as, for example, a notebook, tablet, mobile phone, or other device with at least one small speaker) configured to perform any embodiment of the inventive method on an input audio signal. For example, system 9 of FIG. 1 may be a playback device which includes all of elements 1, 3, 5, and 7 of FIG. 1 (so that the device implements all such elements), or an audio processor which includes (in the sense that it implements) all of elements 1, 3, and 5 of FIG. 1.

In a class of embodiments, the invention is an audio playback system (e.g., system 9 implemented as a notebook, tablet, mobile phone, or other device with small speakers, or a playback system which has limited (e.g., physically-limited) bass reproduction capabilities), and is configured to perform audio enhancement (e.g., bass enhancement) on audio in response to compression feedback (in accordance with any embodiment of the inventive method) to generate enhanced audio, and to playback the enhanced audio.

In typical embodiments, the inventive system is or includes a general or special purpose processor (e.g., an implementation of elements 1, 3, and 5 of system 9 of FIG. 1, or an implementation of element 1 FIG. 1 or FIG. 2) programmed with software (or firmware) and/or otherwise configured to perform an embodiment of the inventive method. In some embodiments, the inventive system is a general purpose processor, coupled to receive input audio data, and programmed (with appropriate software) to generate output audio data in response to the input audio data by performing an embodiment of the inventive method. In some embodiments, the inventive system is a digital signal processor (e.g., an implementation of elements 1, 3, and 5 of system 9 of FIG. 1, or an implementation of element 1 FIG. 1 or FIG. 2), coupled to receive input audio data, and configured (e.g., programmed) to generate output audio data in response to the input audio data by performing an embodiment of the inventive method.

While specific embodiments of the present invention and applications of the invention have been described herein, it will be apparent to those of ordinary skill in the art that many variations on the embodiments and applications described herein are possible without departing from the scope of the invention described and claimed herein. It should be understood that while certain forms of the invention have been shown and described, the invention is not to be limited to the specific embodiments described and shown or the specific methods described.

What is claimed is:

1. A method for audio signal compression and enhancement, including steps of:

performing the enhancement on an input audio signal to generate an enhanced audio signal; and performing multiband compression on the enhanced audio signal, thereby generating a compressed, enhanced audio signal, wherein the enhancement is performed in response to compression feedback indicative of amount of compression applied to each of at least two frequency bands of the enhanced audio signal, wherein the enhancement is bass enhancement, the bass enhancement includes psychoacoustic bass enhancement and equalization-type bass enhancement, and the enhanced audio signal is a linear combination of a first frequency component output from the psychoacoustic bass enhancement and a second frequency component output from the equalization-type bass enhancement.

2. The method of claim 1, wherein the bass enhancement is performed in response to the compression feedback includes selectively applying one of the psychoacoustic bass enhancement or the equalization-type bass enhancement, or both of the psychoacoustic bass enhancement and the equalization-type bass enhancement to the input audio signal in a manner controlled by the compression feedback.

3. The method of claim 1, wherein the enhancement is or includes at least one of dialog enhancement, upmixing, frequency shifting, harmonic injection, harmonic transposition, subharmonic injection, virtualization, equalization, volume modeling, volume leveling, or automatic gain control.

4. The method of claim 1, wherein the enhancement is or includes automatic gain control.

5. The method of claim 1, wherein the multiband compression is performed on the enhanced audio signal, in a manner intended to prevent distortion upon playback of the compressed, enhanced audio signal.

6. The method of claim 1, wherein the input audio signal is indicative of audio content, said method including a step of:
in response to the input audio signal, generating banded frequency domain audio data indicative of the audio content, such that the banded frequency domain audio data includes a sequence of frequency components for each different frequency band of a set of frequency bands, and wherein the enhancement is performed on the banded frequency domain audio data.

7. A non-transitory computer-readable storage medium comprising a sequence of instructions which, when performed by one or more processors, cause the one or more processors to perform the method of claim 1.

8. A system, including:
an enhancement subsystem coupled and configured to perform enhancement on an input audio signal to generate an enhanced audio signal; and
a multiband compressor, coupled and configured to perform multiband compression on the enhanced audio signal, thereby generating a compressed, enhanced audio signal, and to provide compression feedback to the enhancement subsystem, wherein the compression feedback is indicative of amount of compression applied by the multiband compressor to each of at least two frequency bands of the enhanced audio signal, and
wherein the enhancement subsystem is configured to perform the enhancement in response to the compression feedback, wherein the enhancement is bass enhancement, the bass enhancement includes psychoacoustic bass enhancement and equalization-type bass enhancement, and the enhanced audio signal is a linear combination of a first frequency component output from the psychoacoustic bass enhancement and a second frequency component output from the equalization-type bass enhancement.

9. The system of claim 8, wherein the enhancement subsystem is configured to selectively apply one of the psychoacoustic bass enhancement or the equalization-type bass enhancement, or both of the psychoacoustic bass enhancement and the equalization-type bass enhancement to the input audio signal in a manner controlled by the compression feedback.

10. The system of claim 8, wherein the enhancement is or includes at least one of dialog enhancement, upmixing, frequency shifting, harmonic injection, harmonic transposition, subharmonic injection, virtualization, or equalization, volume modeling, volume leveling, or automatic gain control.

11. The system of claim 8, wherein the enhancement is or includes automatic gain control.

12. The system of claim 8, wherein said system is an audio playback system.

13. The system of claim 8, wherein said system is a processor programmed to implement the enhancement subsystem and the multiband compressor.

14. The system of claim 8, wherein said system is a digital signal processor configured to implement the enhancement subsystem and the multiband compressor.

* * * * *